United States Patent [19]

Gergis et al.

[11] 4,435,784

[45] Mar. 6, 1984

[54] MULTI-REPLICATOR STRETCHER DETECTOR

[75] Inventors: Isoris S. Gergis, Yorba Linda; Wai-Tak P. Lee, Santa Ana, both of Calif.

[73] Assignee: Rockwell International Corporation, El Segundo, Calif.

[21] Appl. No.: 200,816

[22] Filed: Oct. 27, 1980

[51] Int. Cl.$^3$ .............................................. G11C 19/08
[52] U.S. Cl. ........................................ 365/8; 365/12; 365/19
[58] Field of Search ...................... 365/8, 12, 19, 1, 29

[56] References Cited

U.S. PATENT DOCUMENTS 3,743,851 7/1973 Kohara ................................... 365/12
3,893,089 7/1975 Almasi et al. .......................... 365/19
4,120,046 10/1978 Chen ...................................... 365/12

OTHER PUBLICATIONS

IBM Technical Disclosure Bulletin-vol. 13, No. 6, Nov. 1970, p. 1409.
AIP Conference on Magnetism & Magnetic Materials-No. 29, Phil., Pa., Dec. 9-12, 1975, p. 47.

Primary Examiner—James W. Moffitt
Attorney, Agent, or Firm—H. Fredrick Hamann; Daniel R. McGlynn

[57] ABSTRACT

A detector for magnetic bubble domain devices including an input path for receiving and propagating magnetic bubble domains, an expander device which intersects the input path and functions to expand the bubble domain in a first direction, and a replication device which intersects the expander and functions to cut the expanded bubble into a plurality of magnetic bubble domains and to expand the bubble domain in a second direction. A plurality of detector strips are disposed along the second direction functioning to detect the plurality of magnetic bubble domains.

12 Claims, 6 Drawing Figures

MULTI-REPLICATOR STRETCHER DETECTOR

TECHNICAL FIELD OF THE INVENTION

The invention relates to magnetic bubble domain devices and in particular to bubble domain detectors for detecting the presence of bubbles in a propagation path.

BACKGROUND OF THE INVENTION

Magnetic bubble domain devices are well known in the art. There are two methods by which bubbles are propagated in bubble devices; one is the usual field access type and the second is the current (or conductor) access type. The most familiar mode of operating a magnetic bubble device is termed the "field-access" mode. In this mode, a pattern of magnetically soft elements (such as Permalloy or ion implanted contiguous disks) is formed in a plane adjacent a layer of material in which the bubbles are moved. A magnetic field is generated in the plane of the layer and the field caused to reorient to incrementally-offset radial positions cyclically in the plane. Each element is so shaped that various portions thereof respond to the in-plane field to generate pole-patterns which change as the field precesses. The configuration of adjacent elements sets up a sequence of travelling potential wells in the layer which causes bubble movement.

In current access devices, the necessary potential wells are provided by a set of conductor patterns in which polyphase, usually two or three phase, currents are transmitted. The conductors are typically formed in multiple layers, insulated from one another and driven in a two or three phase manner. An example of such a device is described in U.S. Pat. No. 3,460,116.

Various types of magnetic bubble domain device architectures are known in the prior art, including the major loop/minor loop configuration. The major loop/minor loop configuration, such as described in U.S. Pat. No. 3,618,054, consists of a plurality of first recirculating "minor" channels and a second "major" channel.

Bubble detection normally involves the expansion of the bubble into a long stripe domain for the purpose of increasing the magnetic flux available for sensing to achieve adequate signal level. In field access permalloy devices, the expansion is accomplished by using a number of chevron stacks which act both to propagate and simultaneously expand the bubble perpendicular to the propagation direction. It is, thus, possible to obtain very long stripe domains by gradual expansion over a number of field cycles in as many chevron stacks. The cost is paid only in large detector area.

In current access devices, the bubble expansion is performed in a current driven conductor expander usually in the form of a single conductor loop (such as in U.S. Pat. No. 3,564,518), or a dual conductor gradual expander configuration. In both configurations, large currents are applied for the period required to expand the bubble. The result is that only small expansion lengths can be achieved (practically around 100 μm in 8 μm period devices operating at 100 kHz). The reason is that the power dissipation increases as the square of the expansion length. Furthermore, the prior art configurations do not allow for consecutive bit detection if the expansion time is longer than the stepping rate of the circuit (inverse of the frequency of operation).

Prior to the present invention, there has not been a compact, low-power bubble detector using conductor loops.

SUMMARY OF THE INVENTION

Briefly and in general terms, the invention concerns a detector for magnetic bubble domain devices including an input path for receiving and propagating a magnetic bubble domain, an expander device which intersects the input path and functions to expand the bubble domain in a first direction, and a replication device which intersects the expander and functions to cut the expanded bubble into a plurality of magnetic bubble domains and to expand the bubble domain in a second direction. The actual detector is disposed along the second direction and functions to detect the plurality of magnetic bubble domains.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

FIG. 2b is a timing diagram of the currents and signals applied to the conductors of the configuration shown in FIG. 2a;

DESCRIPTION OF THE PREFERRED EMBODIMENT

Figure 1A:
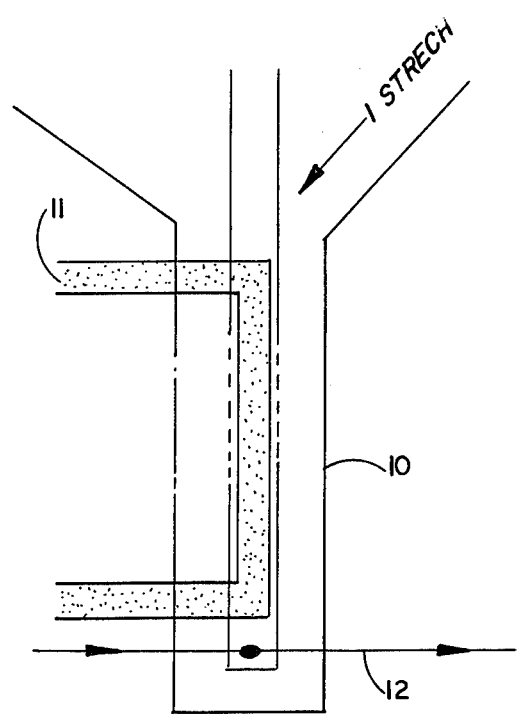
FIG. 1a is a highly schematic diagram of a current loop stretcher as is known in the prior art.

Turning first to FIG. 1a, there is shown a highly schematic diagram of a top plane view of a current loop stretcher as is known in the prior art. The stretcher includes a single hairpin loop 10 formed of a conductor on a single layer in a magnetic bubble domain device. The bubble propagation path is shown schematically by the element 12. The element 11 schematically indicates a magneto-resistive detector in the device.

Figure 1B:
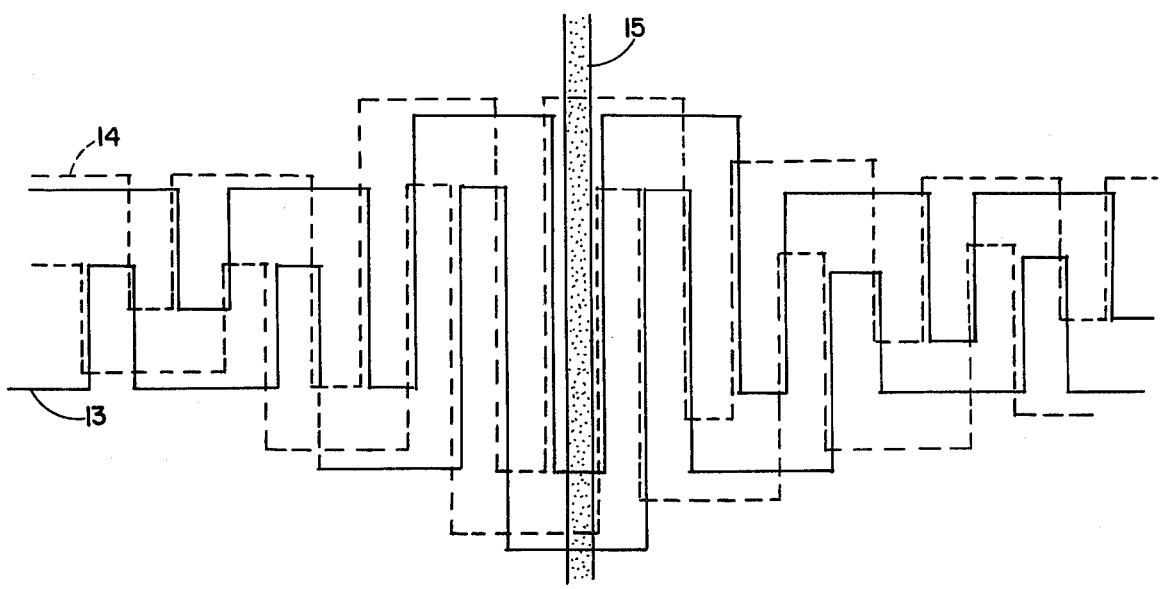
FIG. 1b is a dual conductor gradual expander configuration for current access bubble domain devices as is known in the prior art.

Turning next to FIG. 1b, there is shown a dual conductor gradual expander configuration as is known in the prior art. Such a configuration is based upon two conductor layers 13 and 14 respectively which are electrically and physically isolated from one another in a magnetic bubble domain device. The embodiment of the conductor layers shown in FIG. 1b is that of a meandering conductor loop with a predetermined frequency. The frequency of the first loop 13 is the same as that of the second loop 14, but the two loops 13 and 14 are offset in phase from one another. The amplitude of the loops increase to a predetermined maximum amplitude after which they decrease. At the approximate point of maximum amplitude at the position of element 15, the bubble has expanded in the vertical direction to the amplitude of the loops whereby they may be detected at that point by a magnetoresistor sensor element 15 or other detection means as is known in the art.

First, it is useful to prove that the energy dissipation in the prior art conductor expanders per bubble is given by:

$$E = KS^2 = K_1 L^2$$

where S is the signal strength which is linearly proportional to the expander length L. The constants K, and $K_1$, are functions of the garnet parameters, the specific resistance of the conductor, domain wall velocity, but are not related to the frequency of operation. The proof is straight forward for the configuration of FIG. 1a. The expansion time $\tau$ is related to L by $\tau = L/v$ where v is the domain wall velocity (saturation velocity). The resistance of the conductor is also linearly proportional to L, and, thus, the energy dissipation can be written as:

$$E(n) = I^2 R \tau = K_1 L^2 = KS^2$$

where $K_1 = (I^2 r)/v$, $r = R/L$ = conductor resistance per unit length.

For the configuration of FIG. 1b, we assume the case where the required expansion time is n times the current cycle time, i.e., $\tau = n \cdot t_o$, where $t_o = 1/f$ and f is the frequency of operation of the device. Now, the total expander length is approximately related to the final domain length L by the relation $L_{tot} = nL$, after allowing the gradual expansion and de-expansion (see FIG. 1b). The energy dissipation is time $\tau$ is given by:

$$E(n) = I^2 R \tau = n K_1 L^2$$

But since n bubbles will be detected in n cycles, the energy dissipation per bubble is only $= K_1 L^2$; the same as in the configuration in FIG. 1a.

Figure 2A:
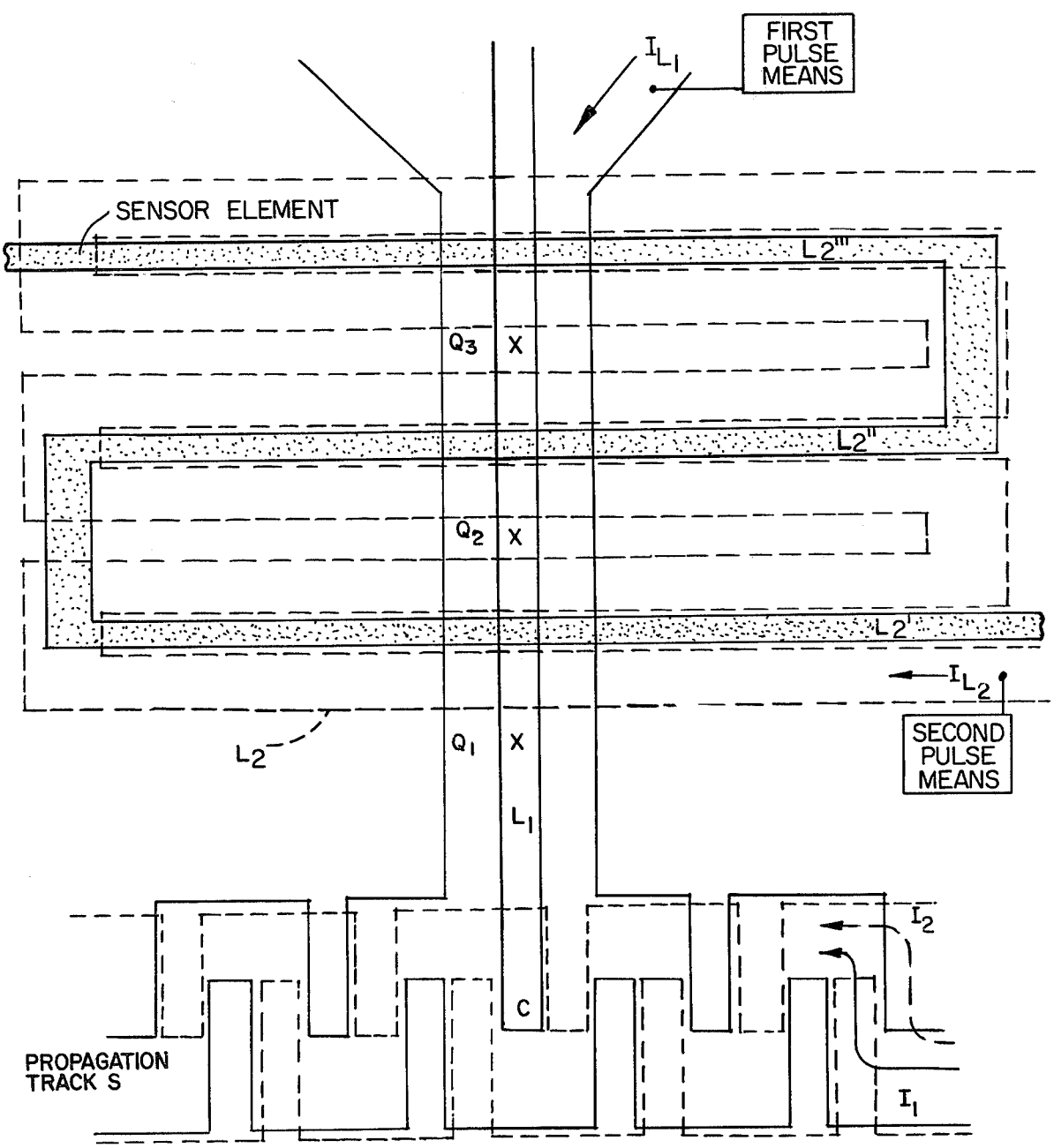
FIG. 2a is a first embodiment of a stretcher detector according to the present invention.

The present invention, shown schematically in FIG. 2a, is composed of two conductor loops $L_1$ and $L_2$ that intersect each other at right angles. Loop $L_1$, which constitutes part of the dual conductor propagation track, is used to expand the bubble, while the multi-loop $L_2$ is used to cut and simultaneously expand the bubble replicas into several long stripe domains. For a given total stripe length L (corresponding to a specific signal S), the individual stripe length in loop $L_2$ is L/N, where N is the number of expansion loops in $L_2$. The expansion time is equal to L/Nv and, thus, the energy dissipation in $L_2$ is:

$$I^2 R \tau = (K_1 L^2)/N = (KS^2)/N$$

Thus, the energy dissipation is reduced by the factor N which is a significant reduction and is especially advantageous at high frequency since the power dissipation is proportional to the frequency:

$$P = Ef = (KS^2 f)/N$$

Figure 2B:
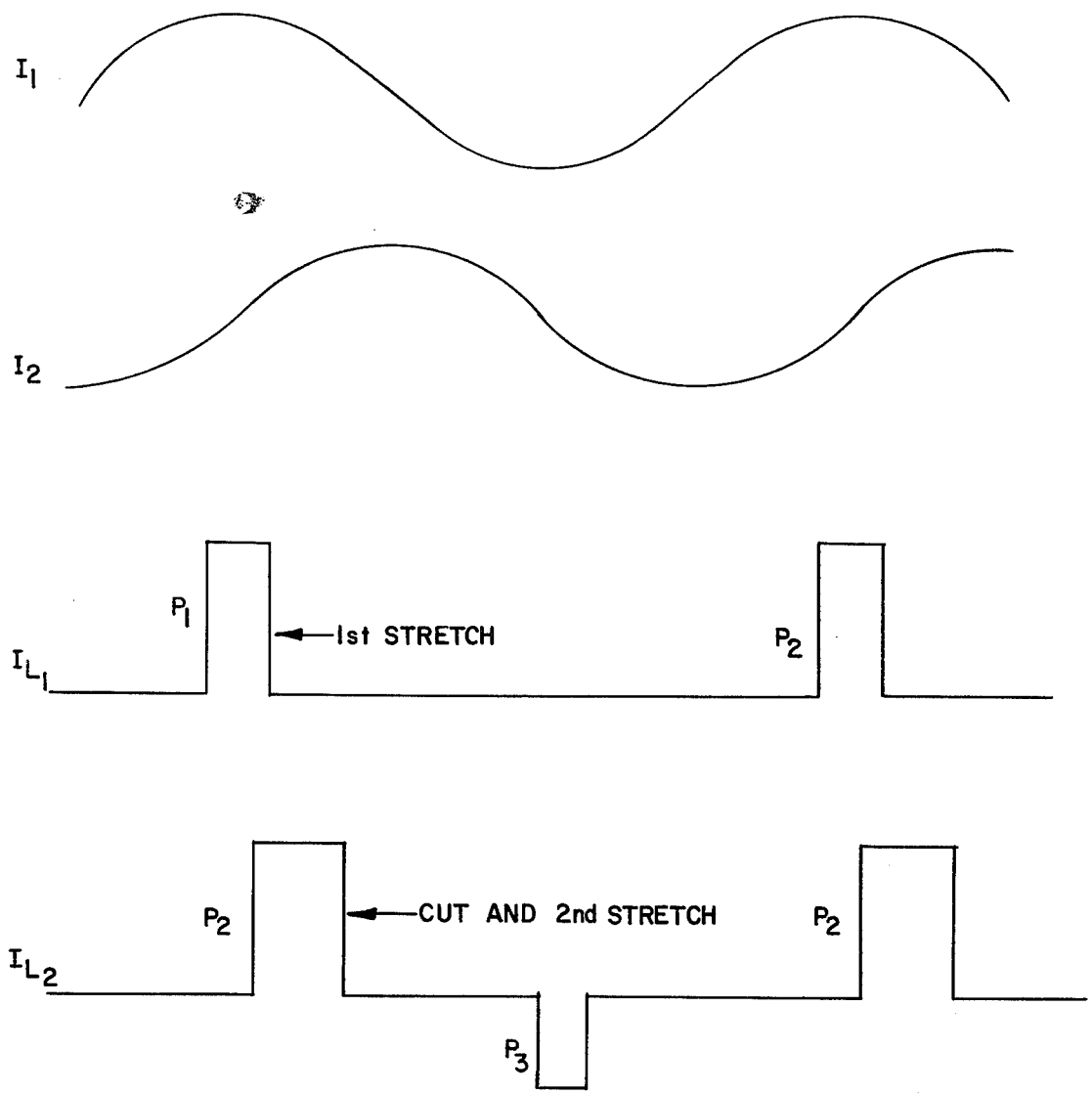

The operation of the multi-replicator stretcher may be explained with reference to the timing diagram shown in FIG. 2b as follows: A bubble propagating in track S (e.g., a major loop) arrives at location C at current phase 1 (as specified in FIG. 2b). A current is applied to L to expand the bubble inside the loop (pulse $P_1$ in FIG. 2b). Before the termination of $P_1$, a second pulse $P_2$ is applied to $L_2$ such that the inside of the subloops $L_2'$, $L_2''$, possess a favorable field, and the outside of the loops will have unfavorable field. The current $P_2$ should be large enough so that upon the termination of $P_1$, the stripe domain (in $L_1$) is severed at locations $Q_1$, $Q_2$, ... etc, and expands inside the subloops $L_2'$, $L_2''$. . . etc. The bubble detection is performed after the bubbles' full expansion via the magnetoresistive sensor elements placed inside loops $L_2'$, $L_2''$ ..., which is represented by the strip defined by the shaded area between the solid lines extending essentially parallel to and between the turns of the multi-loop conductor track, and marked "Sensor Element". Pulse $P_2$ is terminated and the stripes shrink to bubbles and can be annihilated by applying a short pulse $P_3$ to $L_2$ of opposite polarity to $P_2$ to collapse the bubbles.

Thus, not only efficient bubble expansion is achieved in the configuration according to the present invention, but also non-destruction read out is possible since the original bubble is retained in the propagation track.

Figure 3:
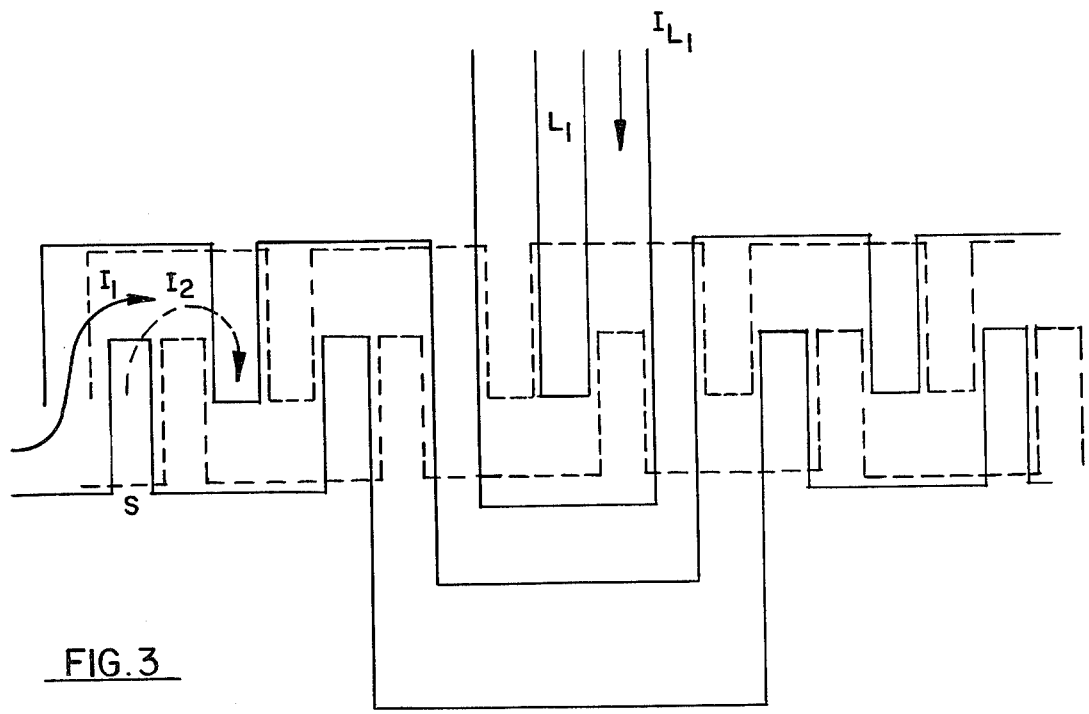
FIG. 3 is a second embodiment of a stretcher detector for current access bubble domain device according to the present invention.
Figure 4:
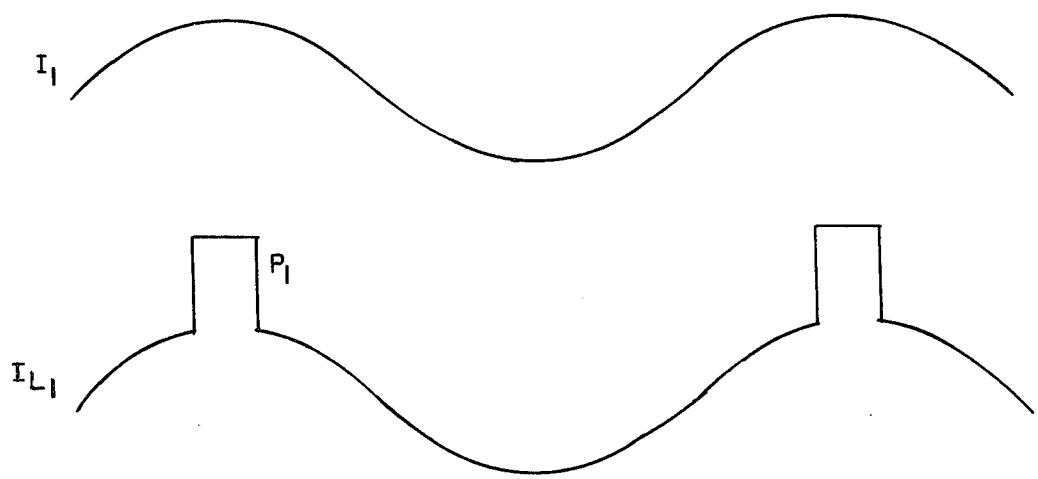
FIG. 4 is a timing diagram of the method of operating the stretcher detectors of the present invention as shown in FIG. 3.

Loop $L_1$ can be connected directly to one of the conductors in the propagation tracks as shown in FIG. 2a or it can be electrically isolated from it as shown in the second embodiment shown in FIG. 3. In the latter case, $L_1$ must carry bipolar current, in addition to $P_1$, in synchronism with the drive currents in the propagation track, to create the continuation of the traveling potential well necessary for bubble propagation. Such a timing diagram is shown in FIG. 4.

While the invention has been illustrated and described as embodied in a multi-replicator stretcher detector and method of fabrication, it is not intended to be limited to the details shown, since various modifications and structural changes may be made without departing in any way from the spirit of the present invention.

It will be obvious to those skilled in the art that the magnetic bubble device according to the present invention can be manufactured with various lithographic technologies and different combinations of known process steps, and that the preferred embodiments illustrated here are merely exemplary. The configuration and distance between the guide elements, as well as their distance to the magnetic bubble layer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example hexagonal ferrites or various crystalline compounds may be used. Moreover, the source, orientation, and frequency of the magnetic field, and the state or dynamic nature of the signals applied to the device may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A detector for magnetic bubble domain devices comprising:

a propagation path comprising a dual conductor propagation track for magnetic bubble domains;

first and second current means connected to said dual conductor propagation track for applying a time varying current thereto;

the current applied to said first conductor track being different in phase than the current applied to said second conductor track so that a magnetic bubble domain is propagated along the dual conductor;

expander means disposed adjacent said propagation path and functioning to expand a bubble domain on said path in a first direction, said expander means comprises a hairpin loop intersecting said propagation path at a substantially right angle;

replication means disposed adjacent said expander means and functioning to cut said expanded bubble into a plurality of magnetic bubble domains and to expand the bubble domains in a second direction different from said first direction;

said replication means comprises a multi-loop conductor track intersecting said expander means at approximately a right angle; and detection means disposed along said second direction and functioning to detect said plurality of magnetic bubble domains, said detection means being formed by elongated strips of a magnetoresistive sensor element extending essentially parallel to and between the turns of said multi-loop conductor track.

2. A detector as defined in claim 1, further comprising first pulse means for providing a signal pulse to said expander means, said first signal pulse being of a predetermined duration beginning at a first time instant and ending at a second time instant.

3. A detector as defined in claim 2, further comprising second pulse means for providing a first signal pulse of a predetermined duration to said replication means at a third time instant, said third time instant being after said first time instant and before said second time instant.

4. A detector as defined in claim 3, wherein said second pulse means provides a second pulse of opposite polarity to said replication means after said first signal pulse, said second pulse being applied after detection of said bubbles for collapsing said bubbles.

5. A detector as defined in claim 1, wherein said hairpin loop comprises a conductor which makes physical and electrical contact with one of said conductors of said dual conductor track.

6. A detector as defined in claim 1, wherein said hairpin loop is a conductor which is physically and electrically spaced apart from said dual conductor track.

7. A detector for magnetic bubble domain devices comprising:

a propagation path for magnetic bubble domains;

expander means disposed adjacent said propagation path and functioning to expand a bubble domain on said path in a first direction;

first pulse means for providing a signal pulse to said expander means, said first signal pulse being of a predetermined duration beginning at a first time instant and ending at a second time instant;

replication means disposed adjacent said expander means and functioning to cut said expanded bubble into a plurality of magnetic bubble domains and to expand the bubble domains in a second direction different from said first direction;

said replication means comprises a multi-loop conductor track intersecting said expander means at approximately a right angle;

second pulse means for providing a first signal pulse of a predetermined duration or said replication means at a third time instant, said third time instant being after said first time instant and before said second time instant; and detection means disposed along said second direction and functioning to detect said plurality of magnetic bubble domains said detection means being formed by elongated strips of a magnetoresistive sensor element extending essentially parallel to and between the turns of said multi-loop conductor track.

8. A detector as defined in claim 7, wherein said propagation path comprises a dual conductor propagation track.

9. A detector as defined in claim 7, further comprising first and second current means connected to said dual conductor propagation track for applying a time varying current thereto; the current applied to said first conductor track being different in phase than the current applied to said second conductor track so that a magnetic bubble domain is propagated along the dual conductor track.

10. A detector as defined in claim 7, wherein said expander means comprises a hairpin loop intersecting said propagation path at a substantially right angle.

11. A detector as defined in claim 10, wherein said replication means comprises a multi-loop conductor track intersecting said expander means at approximately a right angle.

12. A detector as defined in claim 11, wherein said second pulse means provides a second pulse of opposite polarity to said replication means after said first signal pulse, said second pulse being applied after detection of said bubbles for collapsing said bubbles.

* * * * *